(12) United States Patent
Yun et al.

(10) Patent No.: US 10,546,897 B2
(45) Date of Patent: Jan. 28, 2020

(54) PHOTOELECTRIC DEVICE AND IMAGE SENSOR AND ELECTRONIC DEVICE

(71) Applicant: Samsung Electronics Co., Ltd., Suwon-si, Gyeonggi-do (KR)

(72) Inventors: Sung Young Yun, Suwon-si (KR); Gae Hwang Lee, Seongnam-si (KR); Kyung Bae Park, Hwaseong-si (KR); Kwang Hee Lee, Yongin-si (KR); Dong-Seok Leem, Hwaseong-si (KR); Xavier Bulliard, Seongnam-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 72 days.

(21) Appl. No.: 15/478,580

(22) Filed: Apr. 4, 2017

(65) Prior Publication Data
US 2018/0114814 A1    Apr. 26, 2018

(30) Foreign Application Priority Data
Oct. 24, 2016   (KR) .................. 10-2016-0138671

(51) Int. Cl.
H01L 27/30   (2006.01)
H01L 51/42   (2006.01)
H01L 51/00   (2006.01)

(52) U.S. Cl.
CPC ........ *H01L 27/307* (2013.01); *H01L 51/4253* (2013.01); *H01L 51/006* (2013.01);
(Continued)

(58) Field of Classification Search
CPC .................................................... H01L 27/322
See application file for complete search history.

(56) References Cited

U.S. PATENT DOCUMENTS 9,543,361 B2    1/2017   Leem et al.
2008/0061687 A1*  3/2008  Cok .................. H01L 51/5268
                                                    313/506
(Continued)

FOREIGN PATENT DOCUMENTS

JP    2016-092278 A    5/2016
KR    1997-0077713 A   7/1999
KR    20160024686 A    3/2016

OTHER PUBLICATIONS

Scientific reports 3, Article No. 1726(2013), doi:10.1038/srep01726.

*Primary Examiner* — Eugene Lee
(74) *Attorney, Agent, or Firm* — Harness, Dickey & Pierce, P.L.C.

(57) ABSTRACT

A photoelectric device includes a first electrode and a second electrode facing each other, a photoelectric conversion layer between the first electrode and the second electrode and including a light absorbing material configured to selectively absorb first visible light including one of visible light in a blue wavelength region of greater than or equal to about 380 nm and less than about 500 nm, visible light in a green wavelength region of about 500 nm to about 600 nm, and visible light in a red wavelength region of greater than about 600 nm and less than or equal to about 700 nm, and a plurality of nanostructures between the first electrode and the photoelectric conversion layer and configured to selectively reflect the first visible light.

22 Claims, 20 Drawing Sheets

(52) U.S. Cl.
CPC ...... *H01L 51/0046* (2013.01); *H01L 51/0058* (2013.01); *H01L 51/0061* (2013.01); *H01L 51/0062* (2013.01); *H01L 51/0072* (2013.01)

(56) References Cited

U.S. PATENT DOCUMENTS

| | | | |
|---|---|---|---|
| 2012/0097229 A1 | 4/2012 | Aoki | |
| 2013/0014980 A1* | 1/2013 | Takeda | H01L 51/5212 174/257 |
| 2014/0239278 A1* | 8/2014 | Park | H01L 51/442 257/40 |
| 2015/0287945 A1* | 10/2015 | Forrest | H01L 51/447 136/256 |
| 2016/0196928 A1* | 7/2016 | Kojima | H01G 9/2068 136/244 |
| 2016/0254303 A1* | 9/2016 | Takimoto | G02B 5/20 257/432 |

* cited by examiner

PHOTOELECTRIC DEVICE AND IMAGE SENSOR AND ELECTRONIC DEVICE

CROSS REFERENCE TO RELATED APPLICATIONS

This application claims priority to and the benefit of Korean Patent Application No. 10-2016-0138671 filed in the Korean Intellectual Property Office on Oct. 24, 2016, the entire contents of which are incorporated herein by reference.

BACKGROUND

1. Field

Example embodiments provide a photoelectric device, an image sensor, and an electronic device including the same.

2. Description of the Related Art

A photoelectric device may convert light into an electrical signal using photoelectric effects. A photoelectronic device may include a photodiode, a phototransistor, etc. A photoelectronic device may be applied (e.g., included in) various devices, including image sensors, a solar cell, an organic light emitting diode, some combination thereof, etc.

An image sensor including a photodiode requires relatively high resolution and thus a smaller pixel. At present, a silicon photodiode is widely used. In some cases, a silicon photodiode exhibits a problem of deteriorated sensitivity because of a relatively small absorption area due to relatively small pixels. Accordingly, an organic material that is capable of replacing silicon has been researched.

An organic material has a relatively high extinction coefficient and selectively absorbs light in a particular wavelength region depending on a molecular structure, and thus may simultaneously replace a photodiode and a color filter and resultantly improve sensitivity and contribute to relatively high integration.

However, the organic material may be different from silicon due to having a relatively higher binding energy than silicon and exhibiting a recombination behavior. Thus, an organic photoelectric device that includes the organic material may exhibit a relatively low photoelectronic conversion efficiency, and thus relatively low photoelectronic conversion performance, relative to a silicon-based photoelectric device.

SUMMARY

Example embodiments provide a photoelectric device capable of increasing light absorption characteristics and wavelength selectivity.

Example embodiments also provide an image sensor including the photoelectric device.

Example embodiments also provide an electronic device including the image sensor.

According to example embodiments, a photoelectric device includes a first electrode and a second electrode facing each other, a photoelectric conversion layer between the first electrode and the second electrode and including a light absorbing material that selectively absorbs first visible light including one of visible light in a blue wavelength region of greater than or equal to about 380 nm and less than about 500 nm, visible light in a green wavelength region of about 500 nm to about 600 nm, and visible light in a red wavelength region of greater than about 600 nm and less than or equal to about 700 nm, and a plurality of nanostructures between the first electrode and the photoelectric conversion layer and configured to selectively reflect the first visible light.

The plurality of nanostructures may have a hemisphere or hemiellipse shape having a radius of greater than or equal to about 2 nm and less than 6 nm.

The plurality of nanostructures may include a reflective metal, a reflective semi-metal, a reflective oxide, a reflective nitride, a reflective organic material, or a combination thereof.

The plurality of nanostructures may be on the first electrode and the plurality of nanostructures may cover about 20% to about 90% of the entire area of the first electrode.

The first visible light may be visible light in a green wavelength region of about 500 nm to about 600 nm.

The plurality of nanostructures may transmit visible light in a blue wavelength region of greater than or equal to about 380 nm and less than about 500 nm and visible light in a red wavelength region of greater than about 600 nm and less than or equal to about 700 nm.

The photoelectric conversion layer may include a p-type semiconductor and an n-type semiconductor to form a pn junction and at least one of the p-type semiconductor and the n-type semiconductor may be a light absorbing material that selectively absorbs the first visible light.

The p-type semiconductor may be a light absorbing material that selectively absorbs the first visible light.

The n-type semiconductor may be fullerene or a fullerene derivative.

A composition ratio (p/n) of the p-type semiconductor relative to the n-type semiconductor of the photoelectric conversion layer may be greater than about 1.0.

The composition ratio (p/n) of the p-type semiconductor relative to the n-type semiconductor of the photoelectric conversion layer may be greater than or equal to about 1.5.

The composition ratio (p/n) of the p-type semiconductor relative to the n-type semiconductor of the photoelectric conversion layer may be about 2.0 to about 3.0.

The photoelectric conversion layer may have a thickness of less than or equal to about 100 nm.

The photoelectric conversion layer may have a thickness of about 20 nm to about 80 nm.

The photoelectric device may further include an auxiliary layer between the photoelectric conversion layer and the plurality of nanostructures.

According to example embodiments, an image sensor includes the photoelectric device.

According to example embodiments, an electronic device includes the image sensor.

A photoelectric device according to example embodiments is capable of increasing light absorption characteristics and wavelength selectivity.

DETAILED DESCRIPTION

Figure 1:
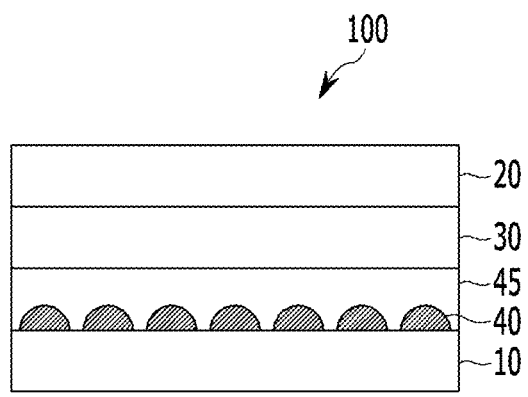
FIG. 1 is a cross-sectional view showing a photoelectric device according to example embodiments.

Hereinafter, example embodiments will hereinafter be described in detail, and may be more easily performed by those who have common knowledge in the related art. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element, there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

In the drawings, parts having no relationship with the description are omitted for clarity of the embodiments, and the same or similar constituent elements are indicated by the same reference numerals throughout the specification.

Hereinafter, 'combination' refers to a mixture of two or more and a stack structure of two or more.

Hereinafter, a photoelectric device according to example embodiments is described referring to drawings.

FIG. 1 is a cross-sectional view showing a photoelectric device according to example embodiments.

Referring to FIG. 1, a photoelectric device 100 according to example embodiments includes a first electrode 10 and a second electrode 20 facing each other, a photoelectric conversion layer 30, a plurality of nanostructures 40, and an auxiliary layer 45.

A substrate (not shown) may be disposed at the first electrode 10 or the second electrode 20. The substrate may at least partially comprise, for example, an inorganic material including glass, an organic material including polycarbonate, polymethylmethacrylate, polyethyleneterephthalate, polyethylenenaphthalate, polyamide, polyethersulfone, or a combination thereof, or a silicon wafer.

One of the first electrode 10 and the second electrode 20 is an anode and the other is a cathode. For example, the first electrode 10 may be an anode and the second electrode 20 may be a cathode.

At least one of the first electrode 10 and the second electrode 20 may be a light-transmitting electrode, and the light-transmitting electrode may at least partially comprise, for example, a conductive oxide including indium tin oxide (ITO) or indium zinc oxide (IZO), zinc oxide (ZnO), tin oxide (SnO), aluminum tin oxide (AlTO), and fluorine doped tin oxide (FTO), or a metal thin layer of a thin monolayer or multilayer. When one of the first electrode 10 and the second electrode 20 is a non-light-transmitting electrode, the first electrode 10 or second electrode 20 may at least partially comprise, for example, an opaque conductor including aluminum (Al), silver (Ag), or gold (Au). For example, the first electrode 10 and the second electrode 20 are light-transmitting electrodes. For example, the second electrode 20 may be a light receiving electrode disposed at a light receiving side.

The photoelectric conversion layer 30 includes a p-type semiconductor and an n-type semiconductor to form a pn junction, and absorbs external light to generate excitons and then separates the generated excitons into holes and electrons.

The photoelectric conversion layer 30 may include at least one of light absorbing materials, and one of the light absorbing materials may absorb, for example, light in at least one part of a wavelength region, i.e., a visible ray wavelength region. For example, one of the light absorbing materials may selectively absorb one (hereinafter, referred to as "first visible light") of visible light in a blue wavelength region of greater than or equal to about 380 nm and less than about 500 nm, visible light in a green wavelength region of about 500 nm to about 600 nm and visible light in a red wavelength region of greater than about 600 nm and less than or equal to about 700 nm.

The p-type semiconductor and the n-type semiconductor in the photoelectric conversion layer 30 may each be a light absorbing material, for example, each light absorbing material absorbing light in a visible ray region. At least one of the p-type semiconductor and the n-type semiconductor in the photoelectric conversion layer 30 may be an organic material.

For example, at least one of the p-type semiconductor and the n-type semiconductor in the photoelectric conversion layer 30 may be a light absorbing material that selectively absorbs the first visible light. For example, one of the p-type semiconductor and the n-type semiconductor in the photoelectric conversion layer 30 may be a light absorbing material that selectively absorbs the first visible light. For example, the p-type semiconductor of the photoelectric conversion layer 30 may be a light absorbing material that selectively absorbs the first visible light and the n-type semiconductor may be a light absorbing material that absorbs the first visible light and visible light (hereinafter, referred to as "second visible light") except the first visible light. For example, the p-type semiconductor of the photoelectric conversion layer 30 may be a light absorbing material that selectively absorbs the first visible light and the n-type semiconductor may be fullerene or a fullerene derivative.

For example, one of the p-type semiconductor and the n-type semiconductor of the photoelectric conversion layer 30 may be a light absorbing material that selectively absorbs visible light in a green wavelength region having a maximum absorption wavelength ($\lambda_{max}$) of about 520 nm to about 580 nm and the other of the p-type semiconductor and the n-type semiconductor may be a light absorbing material that absorbs visible light in a green wavelength region of about 500 nm to about 600 nm and visible light in a blue wavelength region of greater than or equal to about 380 nm and less than about 500 nm. For example, one of the p-type semiconductor and the n-type semiconductor may be a light absorbing material that selectively absorbs visible light in a green wavelength region having a maximum absorption wavelength ($\lambda_{max}$) of about 520 nm to about 580 nm and the other of the p-type semiconductor and the n-type semiconductor may be fullerene or a fullerene derivative. For example, the p-type semiconductor of the photoelectric conversion layer 30 may be a light absorbing material that selectively absorbs visible light in a green wavelength region having a maximum absorption wavelength ($\lambda_{max}$) of about 520 nm to about 580 nm and the n-type semiconductor may be fullerene or a fullerene derivative.

For example, one of the p-type semiconductor and the n-type semiconductor of the photoelectric conversion layer 30 may be a light absorbing material that selectively absorbs visible light in a blue wavelength region having a maximum absorption wavelength ($\lambda_{max}$) greater than or equal to about 380 nm and less than about 500 nm and the other of the p-type semiconductor and the n-type semiconductor may be a light absorbing material that absorbs visible light in a blue wavelength region of greater than or equal to about 380 nm and less than about 500 nm and visible light in a green wavelength region of about 500 nm to about 600 nm. For example, one of the p-type semiconductor and the n-type semiconductor of the photoelectric conversion layer 30 may be a light absorbing material that selectively absorbs visible light in a blue wavelength region having a maximum absorption wavelength ($\lambda_{max}$) greater than or equal to about 380 nm and less than about 500 nm and the other of the p-type semiconductor and the n-type semiconductor may be fullerene or a fullerene derivative. For example, the p-type semiconductor of the photoelectric conversion layer 30 may be a light absorbing material that selectively absorbs visible light in a blue wavelength region having a maximum absorption wavelength ($\lambda_{max}$) greater than or equal to about 380 nm and less than about 500 nm and the n-type semiconductor may be fullerene or a fullerene derivative.

For example, one of the p-type semiconductor and the n-type semiconductor of the photoelectric conversion layer 30 may be a light absorbing material that selectively absorbs visible light in a red wavelength region having a maximum absorption wavelength ($\lambda_{max}$) of about 630 nm to about 700 nm and the other of the p-type semiconductor and the n-type semiconductor may be a light absorbing material that absorbs visible light in a blue wavelength region of greater than or equal to about 380 nm and less than about 500 nm and visible light in a green wavelength region of about 500 nm to about 600 nm. For example, one of the p-type semiconductor and the n-type semiconductor may be a light absorbing material that selectively absorbs visible light in a red wavelength region having a maximum absorption wavelength ($\lambda_{max}$) of about 630 nm to about 700 nm and the other of the p-type semiconductor and the n-type semiconductor may be fullerene or a fullerene derivative. For example, the p-type semiconductor of the photoelectric conversion layer 30 may be a light absorbing material that selectively absorbs visible light in a red wavelength region having a maximum absorption wavelength ($\lambda_{max}$) of about 630 nm to about 700 nm and the n-type semiconductor may be fullerene or a fullerene derivative.

For example, the p-type semiconductor may have a core structure including an electron donating moiety, a pi-conjugation linker, and an electron accepting moiety. Herein, the electron donating moiety is a moiety that donates electrons and forms holes when receiving light and the electron accepting moiety is a moiety that accepts electrons when receiving light.

The photoelectric conversion layer 30 may include an intrinsic layer (I layer) that includes the p-type semiconductor and the n-type semiconductor mixed in a form of a bulk heterojunction. For example, the p-type semiconductor and the n-type semiconductor of the photoelectric conversion layer 30 may be uniformly mixed at the same composition ratio along a thickness direction of the photoelectric conversion layer 30. For example, the p-type semiconductor and the n-type semiconductor of the photoelectric conversion layer 30 may be mixed at a different composition ratio along a thickness direction of the photoelectric conversion layer 30.

For example, when the p-type semiconductor of the photoelectric conversion layer 30 is a light-absorbing material that selectively absorbs the first visible light, while the n-type semiconductor is, for example, a light absorbing material, e.g., a fullerene or fullerene derivative, that absorbs the first visible light and the second visible light in a relatively wide wavelength range, the photoelectric conversion layer 30 may include relatively more in the p-type semiconductor than the n-type semiconductor. In this way, the p-type semiconductor may increase absorbance about the first visible light and thus external quantum efficiency (EQE) for the first visible light. Accordingly, wavelength selectivity of the photoelectric device 100 for the first visible light may be increased.

For example, when the p-type semiconductor is a light absorbing material that selectively absorbs visible light in a green wavelength region having a maximum absorption wavelength ($\lambda_{max}$) of about 520 nm to about 580 nm and the n-type semiconductor is fullerene or a fullerene derivative, the photoelectric conversion layer 30 includes the p-type semiconductor in a relatively larger amount, and thereby light absorption in a green wavelength region may be increased, and thus, external quantum efficiency (EQE) in a green wavelength region may be increased. Accordingly, wavelength selectivity of the photoelectric device 100 may be increased.

For example, the photoelectric conversion layer 30 may be a p-type rich layer including the p-type semiconductor more than the n-type semiconductor, and herein, the p-type semiconductor relative to the n-type semiconductor in the photoelectric conversion layer 30 may be, for example, used in a composition ratio (p/n) of greater than about 1.0. Herein, the composition ratio of the p-type semiconductor and the n-type semiconductor may be defined as a volume of the p-type semiconductor relative to a volume of the n-type semiconductor and expressed as p/n. For example, the composition ratio (p/n) of the p-type semiconductor relative to the n-type semiconductor of the photoelectric conversion layer 30 may be in a range of greater than about 1.0 and less than or equal to about 10.0, for example, about 1.2 to about 5.0, for example, greater than or equal to about 1.5, for example about 1.5 to about 3.5, or for example about 2.0 to about 3.0.

The photoelectric conversion layer 30 may have a thickness, for example, of less than or equal to about 100 nm. For example, the photoelectric conversion layer 30 may have a thickness of about 5 nm to about 100 nm, about 10 nm to about 90 nm, or about 20 nm to about 80 nm. The photoelectric conversion layer 30 having a relatively thin thickness within the ranges may increase efficiency of the photoelectric device 100, because an electric field is effectively applied to the photoelectric conversion layer 30 as a p-type rich layer.

A plurality of nanostructures 40 may be positioned between the first electrode 10 and the photoelectric conversion layer 30 and reflect a portion of light passing the photoelectric conversion layer 30 into the photoelectric conversion layer 30. Accordingly, absorbance of the photoelectric conversion layer 30 may be increased.

The plurality of nanostructures 40 may selectively reflect light in the same wavelength region as that of light mainly absorbed in the photoelectric conversion layer 30 but pass light in the rest of the wavelength regions. In other words, the plurality of nanostructures 40 may selectively reflect the first visible light but pass the second visible light. For example, the photoelectric conversion layer 30 may selectively absorb a portion of visible light in the green, blue, and red wavelength regions as described above, but the plurality of nanostructures 40 may selectively reflect a portion of visible light in the green, blue, and red wavelength regions.

For example, the photoelectric conversion layer 30 may selectively and mainly absorb visible light in a green wavelength region having a maximum absorption wavelength ($\lambda_{max}$) of about 520 nm to about 580 nm and a plurality of nanostructures 40 may selectively and mainly reflect visible light in a green wavelength region having a maximum absorption wavelength ($\lambda_{max}$) of about 520 nm to about 580 nm. The plurality of nanostructures 40 may pass visible light in the blue and red wavelength regions except for visible light in the green wavelength region.

For example, the photoelectric conversion layer 30 may selectively and mainly absorb visible light in a blue wavelength region having a maximum absorption wavelength ($\lambda_{max}$) greater than or equal to about 380 nm and less than about 500 nm and the plurality of nanostructures 40 may selectively and mainly reflect visible light in a blue wavelength region having a maximum absorption wavelength ($\lambda_{max}$) greater than or equal to about 380 nm and less than about 500 nm. The plurality of nanostructures 40 may pass visible light in the green and red wavelength regions except for visible light in the blue wavelength region.

For example, the photoelectric conversion layer 30 may selectively and mainly absorb visible light of the red wavelength region having a maximum absorption wavelength ($\lambda_{max}$) of about 630 nm to about 700 nm, while the plurality of nanostructures 40 may selectively and mainly reflect visible light of the red wavelength region having a maximum absorption wavelength ($\lambda_{max}$) of about 630 nm to about 700 nm. The plurality of nanostructures 40 may pass visible light of the blue and green wavelength regions except for visible light of the red wavelength region.

Accordingly, because light of a given or predetermined wavelength region not absorbed in the photoelectric conversion layer 30 is reflected by the plurality of nanostructures 40 and reabsorbed in the photoelectric conversion layer 30, absorbance of the photoelectric conversion layer 30 may be increased.

The plurality of nanostructures 40 may have any structure selectively reflecting or passing light of the given or predetermined wavelength region without a particular limit, for example, a hemisphere or hemiellipse shape.

Figure 2:
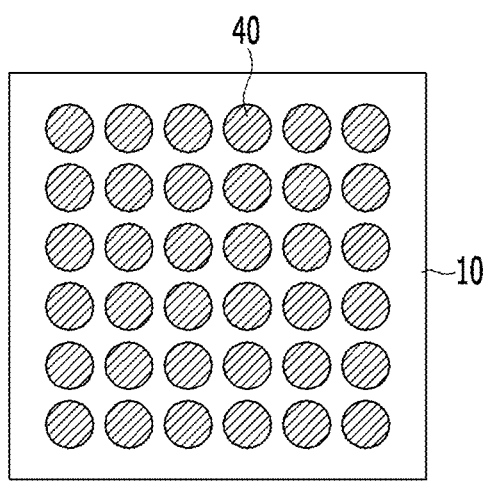
FIG. 2 is a top plan view showing an example arrangement of nanostructures in the photoelectric device of FIG. 1.
Figure 3:
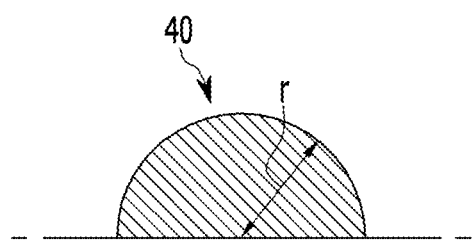
FIG. 3 is a schematic view showing hemisphere-shaped nanostructures in the photoelectric device of FIG. 1.
Figure 4:
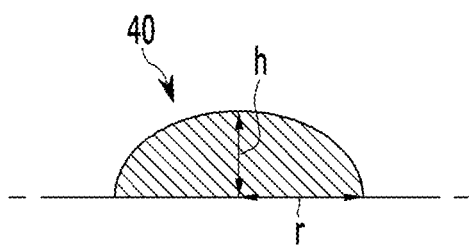
FIG. 4 is a schematic view showing hemiellipse-shaped nanostructures in the photoelectric device of FIG. 1.

FIG. 2 is a top plan view showing an example arrangement of nanostructures in the photoelectric device of FIG. 1, FIG. 3 is a schematic view showing hemisphere-shaped nanostructures in the photoelectric device of FIG. 1, and FIG. 4 is a schematic view showing hemiellipse-shaped nanostructures in the photoelectric device of FIG. 1.

Referring to FIG. 2, the plurality of nanostructures 40 may be directly formed on the first electrode 10 or on another layer disposed on the first electrode, for example, in direct contact with the first electrode 10. For example, the plurality of nanostructures 40 may be aligned along a row and/or a column or randomly on the first electrode 10. Each nanostructure 40 is separated with a given or predetermined interval from the other neighboring nanostructures 40, and accordingly, the nanostructures 40 do not cover a whole surface of the first electrode 10 but a portion of the first electrode 10. For example, the plurality of nanostructures 40 may cover about 20% to about 90% of the surface of the first electrode 10 out of the entire surface area thereof. The coverage of the plurality of nanostructures 40 may be, for example, about 30% to about 85%, about 30% to about 80%, or about 30% to about 70% within the ranges. When the plurality of nanostructures 40 has coverage within the ranges, light of the given or predetermined wavelength region may be effectively reflected.

Referring to FIG. 3, the nanostructures 40 may have a hemisphere shape. The hemispherical nanostructures 40 may have a nano-level radius (r), for example, a radius of greater than or equal to about 2 nm and less than about 6 nm. When the radius is within the ranges, light of a given or predetermined wavelength region may be reflected upward, that is, into the photoelectric conversion layer 30. The radius may be for example about 2 nm to about 5.5 nm, about 2 nm to about 5 nm, about 2 nm to about 4.5 nm, or about 2 nm to about 4 nm within the ranges.

Referring to FIG. 4, the nanostructure 40 may have a hemiellipse shape. The hemiellipse-shaped nanostructure 40 may have a nano-level radius (r), for example, a radius of greater than or equal to about 2 nm and less than about 6 nm. The radius may be for example about 2 nm to about 5.5 nm, about 2 nm to about 5 nm, about 2 nm to about 4.5 nm, or about 2 nm to about 4 nm within the ranges. As for the hemiellipse-shaped nanostructure 40, the radius (r) is a half of a longest diameter from a center. The hemiellipse-shaped nanostructure 40 may have a half of the shortest diameter from the center, that is, a height (h), and the height (h) may be about 1 nm to about 3 nm.

The plurality of nanostructures 40 may include a material capable of reflecting light, i.e., a reflective material, for example, a reflective metal, a reflective semi-metal, a reflective oxide, a reflective nitride, a reflective organic material, or a combination thereof. For example, the plurality of nanostructures 40 may be silver (Ag), gold (Au), aluminum (Al), an alloy thereof, or a combination thereof, but are not limited thereto.

The plurality of nanostructures 40 may be realized in various methods. For example, the nanostructures may be formed by depositing an ultrathin film reflection layer having a thickness of less than or equal to about 10 nm on the first electrode 10 and then, heat-treating the resultant at about 80° C. to about 200° C. For example, the nanostructures may be formed by depositing an ultrathin film refection layer having a thickness of less than or equal to about 10 nm on the first electrode 10 and then, etching using a mask. For example, the nanostructures may be formed by imprinting. However, the nanostructures may be formed by various processes, and the present disclosure is not limited thereto.

The auxiliary layer 45 may be, for example, a charge auxiliary layer, and may cover the plurality of nanostructures 40.

The auxiliary layer 45 may facilitate, for example, transfer of holes and electrons separated from the photoelectric conversion layer 30 and the first electrode 10, and may be, for example, at least one selected from a hole injection layer (HIL) for facilitating hole injection, a hole transport layer (HTL) for facilitating hole transport, an electron blocking layer (EBL) for inhibiting or preventing electron transport, an electron injection layer (EIL) for facilitating electron injection, an electron transport layer (ETL) for facilitating electron transport, and a hole blocking layer (HBL) for inhibiting or preventing hole transport, but is not limited thereto.

The auxiliary layer 45 may include, for example, an organic material, an inorganic material, or an organic/inorganic material. The organic material may be an organic compound having hole or electron characteristics, and the inorganic material may be, for example, a metal oxide (e.g., molybdenum oxide, tungsten oxide, nickel oxide, etc.)

An auxiliary layer (not shown) may be formed between the second electrode 20 and the photoelectric conversion layer 30. The auxiliary layer may be also a hole injection layer (HIL), a hole transport layer (HTL), an electron blocking layer, electron injection layer (EIL), an electron transport layer (ETL), and/or a hole blocking layer, but is not limited thereto.

An anti-reflection layer (not shown) may be further included on an outer surface of the second electrode 20. The anti-reflection layer is disposed at a light incidence side and lowers reflectance of light of incident light and thereby light absorption is further improved.

The anti-reflection layer may include, for example a material having a refractive index of about 1.6 to about 2.5, and may include, for example, at least one of a metal oxide, a metal sulfide, and an organic material having a refractive index within the ranges. The anti-reflection layer may include, for example, a metal oxide including an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide, e.g., zinc sulfide; or an organic material, e.g., an amine derivative, but is not limited thereto.

In the photoelectric device 100, a part of light enters from the second electrode 20, is absorbed by the photoelectric conversion layer 30 and reflected by a plurality of nanostructures 40, and thereby excitons may be produced inside the photoelectric conversion layer 30. The excitons are separated into holes and electrons in the photoelectric conversion layer 30, and the separated holes are transported to an anode that is one of the first electrode 10 and second electrode 20 and the separated electrons are transported to the cathode that is the other of and the first electrode 10 and the second electrode 20 so as to flow a current.

The photoelectric device 100 may be applied to a solar cell, an image sensor, a photo-detector, a photo-sensor, and an organic light emitting diode (OLED), but is not limited thereto.

The photoelectric device may be, for example, applied to an image sensor.

Hereinafter, an example of an image sensor including the photoelectric device is described referring to drawings. As an example of an image sensor, a CMOS image sensor is illustrated.

Figure 5:
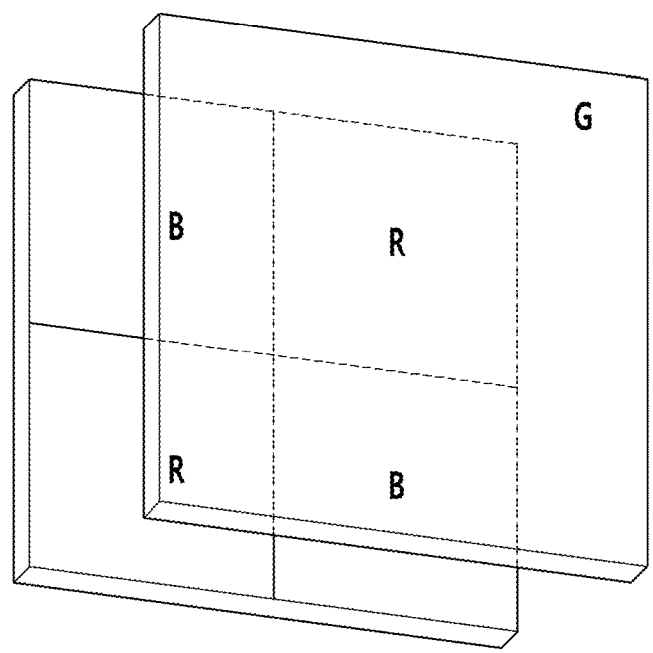
FIG. 5 is a schematic top plan view of a CMOS image sensor according to example embodiments.
Figure 6A:
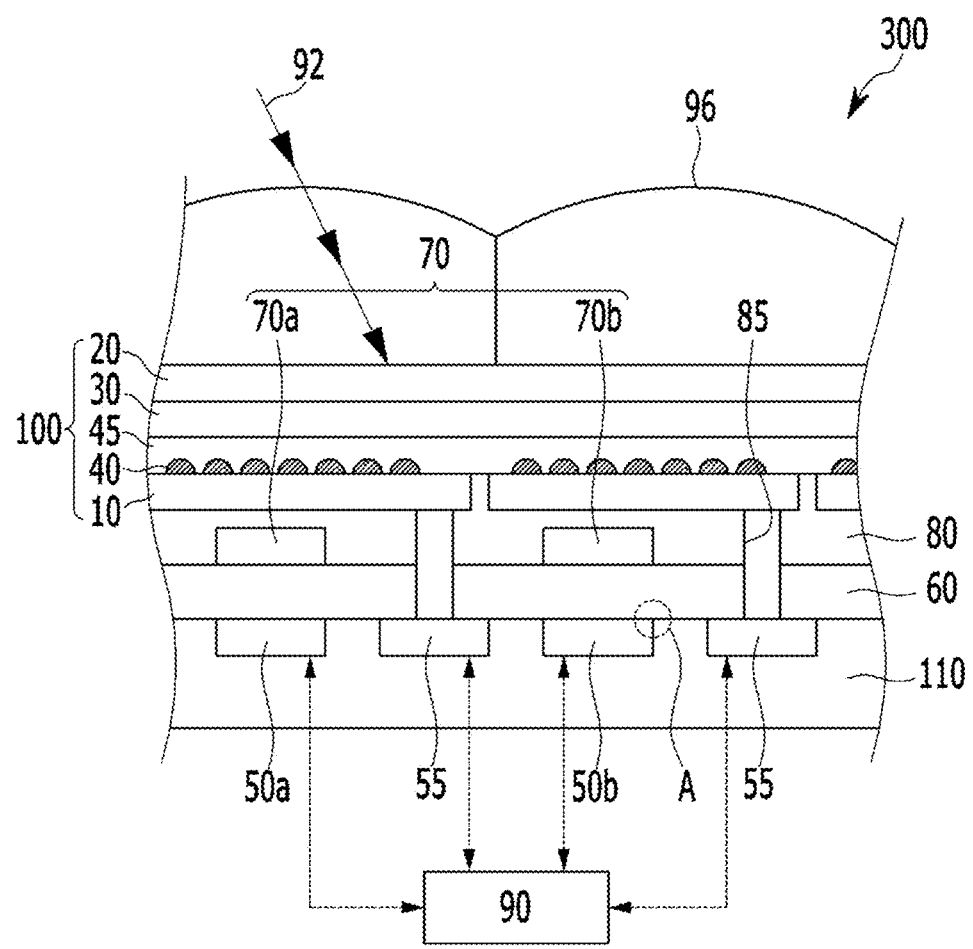
FIG. 6A is a cross-sectional view showing one example of the CMOS image sensor of FIG. 5.
Figure 6B:
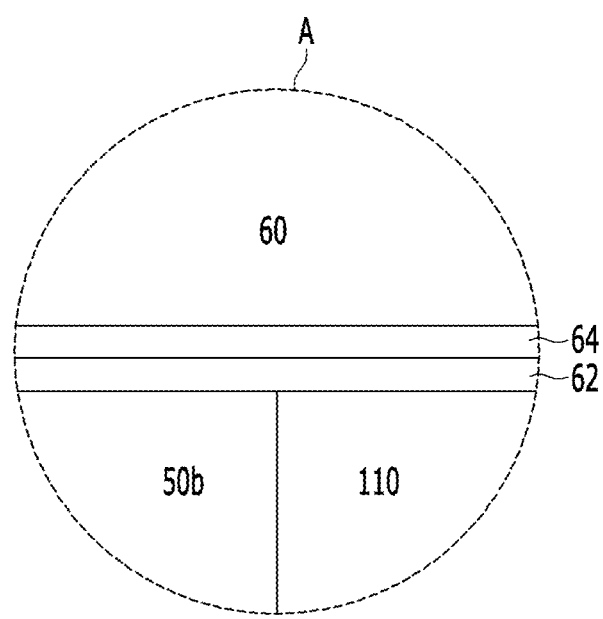
FIG. 6B is a cross-section view of a portion A of the image sensor 300 illustrated in FIG. 6A.

FIG. 5 is a schematic top plan view of a CMOS image sensor according to example embodiments and FIG. 6A is a cross-sectional view showing one example of the CMOS image sensor of FIG. 5, and FIG. 6B is a cross-section view of a portion A of the image sensor 300 illustrated in FIG. 6A.

Referring to FIGS. 5, 6A and 6B, a CMOS image sensor 300 according to example embodiments includes a semiconductor substrate 110 integrated with photo-sensing devices 50a and 50b, a transmission transistor (not shown), and a charge storage device 55, a lower insulation layer 60, a color filter layer 70, an upper insulation layer 80, and a photoelectric device 100.

The semiconductor substrate 110 may be a silicon substrate, and is integrated with the photo-sensing devices 50a and 50b, the transmission transistor 90, and the charge storage device 55. The photo-sensing devices 50a and 50b may be photodiodes.

The photo-sensing devices 50a and 50b, the transmission transistor 90 and/or the charge storage device 55 may be integrated in each pixel, and the photo-sensing devices 50a and 50b may be included in a blue pixel and a red pixel and the charge storage device 55 may be included in a green pixel.

The photo-sensing devices 50a and 50b sense light, the information sensed by the photo-sensing devices may be transferred by the transmission transistor 90, and the charge storage device 55 is electrically connected with the photoelectric device 100, so the information of the charge storage device 55 may be transferred by the transmission transistor 90.

In some example embodiments, including the example embodiments shown in FIG. 6B, a metal wire 62 and a pad 64 are formed on the semiconductor substrate 110. In order to decrease signal delay, the metal wire 62 and pad 64 may at least partially comprise a metal having relatively low resistivity, for example, aluminum (Al), copper (Cu), silver (Ag), and alloys thereof, but is not limited thereto. In some example embodiments, the metal wire 62 and pad 64 may be positioned under the photo-sensing devices 50a and 50b.

Referring back to FIG. 6A, the lower insulation layer 60 is formed on the metal wire 62 and the pad 64. The lower insulation layer 60 may at least partially comprise an inorganic insulating material including a silicon oxide and/or a silicon nitride, or a low dielectric constant (low K) material including SiC, SiCOH, SiCO, and SiOF. The lower insulation layer 60 has a through-hole 85 exposing the charge storage device 55. The through-hole 85 may be filled with fillers.

A color filter layer 70 is formed on the lower insulation layer 60. The color filter layer 70 includes a blue filter 70a formed in the blue pixel and a red filter 70b formed in the red pixel. In example embodiments, a green filter is not included, but a green filter may be further included.

The upper insulation layer 80 is formed on the color filter layer 70. The upper insulation layer 80 may eliminate a step caused by the color filter layer 70 and smoothes the surface. The upper insulation layer 80 and lower insulation layer 60 may include a contact hole (not shown) exposing a pad, and the through-hole 85 exposing the charge storage device 55 of a green pixel.

The photoelectric device 100 is formed on the upper insulation layer 80. The photoelectric device 100 includes the first electrode 10, the plurality of nanostructures 40, the auxiliary layer 45, the photoelectric conversion layer 30, and the second electrode 20 as described above.

The first electrode 10 and the second electrode 20 may be transparent electrodes, and the photoelectric conversion layer 30, the plurality of nanostructures 40, and the auxiliary layer 45 are the same as described above. The photoelectric conversion layer 30 may selectively absorb, for example light in a green wavelength region, and replaces a color filter of a green pixel. The plurality of nanostructures 40 may selectively reflect light in a green wavelength region to the photoelectric conversion layer 30 and thereby increases absorbance of the photoelectric conversion layer 30. When light enters from the second electrode 20, the light in a green wavelength region may be mainly absorbed in the photoelectric conversion layer 30 and photo-electrically converted, while the light in the rest of the wavelength regions passes through the first electrode 10 and may be sensed in photo-sensing devices 50a and 50b.

A focusing lens 96 (see FIG. 6A) may be further formed on the photoelectric device 100. The focusing lens may control a direction of incident light 92 and gather the light in one region. The focusing lens may have a shape of, for example, a cylinder or a hemisphere, but is not limited thereto.

The photoelectric device 100 has a stacked structure as described above and thus may realize a down-sized image sensor.

A stack structure where a photoelectric device configured to selectively absorb light in a green wavelength region is stacked is exemplarily illustrated, but the present disclosure is not limited thereto. The present disclosure may have a structure where a photoelectric device configured to selectively absorb light in a blue wavelength region is stacked and a green photo-sensing device and a red photo-sensing device may be integrated in the semiconductor substrate 110, or a structure where a photoelectric device configured to selectively absorb light in a red wavelength region is stacked and a green photo-sensing device and a blue photo-sensing device may be integrated in the semiconductor substrate 110.

Figure 7:
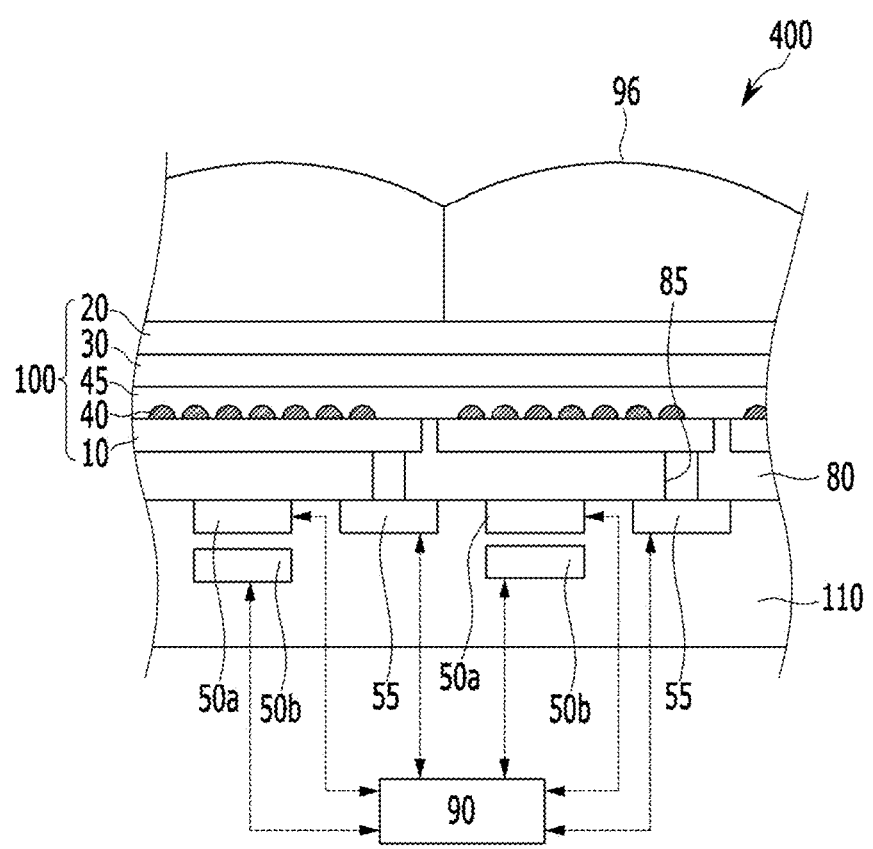
FIG. 7 is a cross-sectional view showing another example of a CMOS image sensor.

FIG. 7 is a cross-sectional view showing another example of a CMOS image sensor.

The CMOS image sensor 400 according to example embodiments like the above example embodiment illustrated in FIG. 6A includes the photo-sensing devices 50a and 50b, the semiconductor substrate 110 in which a transmission transistor (not shown) and the charge storage device 55 are integrated, the upper insulation layer 80 having the through-hole 85, and the photoelectric device 100.

However, in the CMOS image sensor 400 according to example embodiments unlike the above example embodiment illustrated in FIG. 6A, the photo-sensing devices 50a and 50b are stacked in a vertical direction, but the color filter layer 70 is omitted. The photo-sensing devices 50a and 50b are electrically connected to transmission transistor 90, and the information of the charge storage device 55 may be transferred by a transmission transistor (not shown). The photo-sensing devices 50a and 50b may selectively absorb light in each wavelength region depending on a stacking depth. For example, the photo-sensing device 50a may be a blue photo-sensing device and the photo-sensing device 50b may be a red photo-sensing device.

A focusing lens 96 may be further formed on the photoelectric device 100. The focusing lens 96 may control a direction of incident light and gather the light in one region. The focusing lens 96 may have a shape of, for example, a cylinder or a hemisphere, but is not limited thereto.

As described above, the photoelectric device configured to selectively absorb light in a green wavelength region has a stack structure and the red photo-sensing device and the blue photo-sensing device are stacked and thus the size of an image sensor may be reduced to realize a down-sized image sensor.

In FIG. 7, a stack structure where a photoelectric device configured to selectively absorb light in a green wavelength region is stacked is exemplarily illustrated, but the present disclosure is not limited thereto. The present disclosure may have a structure where a photoelectric device configured to selectively absorb light in a blue wavelength region is stacked and a green photo-sensing device and a red photo-sensing device may be integrated in the semiconductor substrate 110, or a structure where a photoelectric device configured to selectively absorb light in a red wavelength region is stacked and a green photo-sensing device and a blue photo-sensing device may be integrated in the semiconductor substrate 110.

Figure 8:
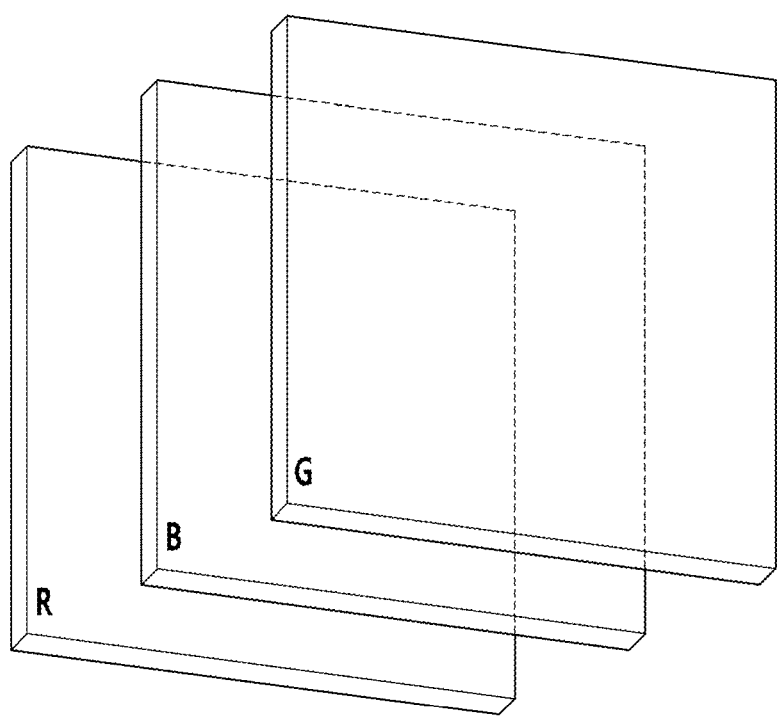
FIG. 8 is a schematic top plan view of a CMOS image sensor according to example embodiments.
Figure 9A:
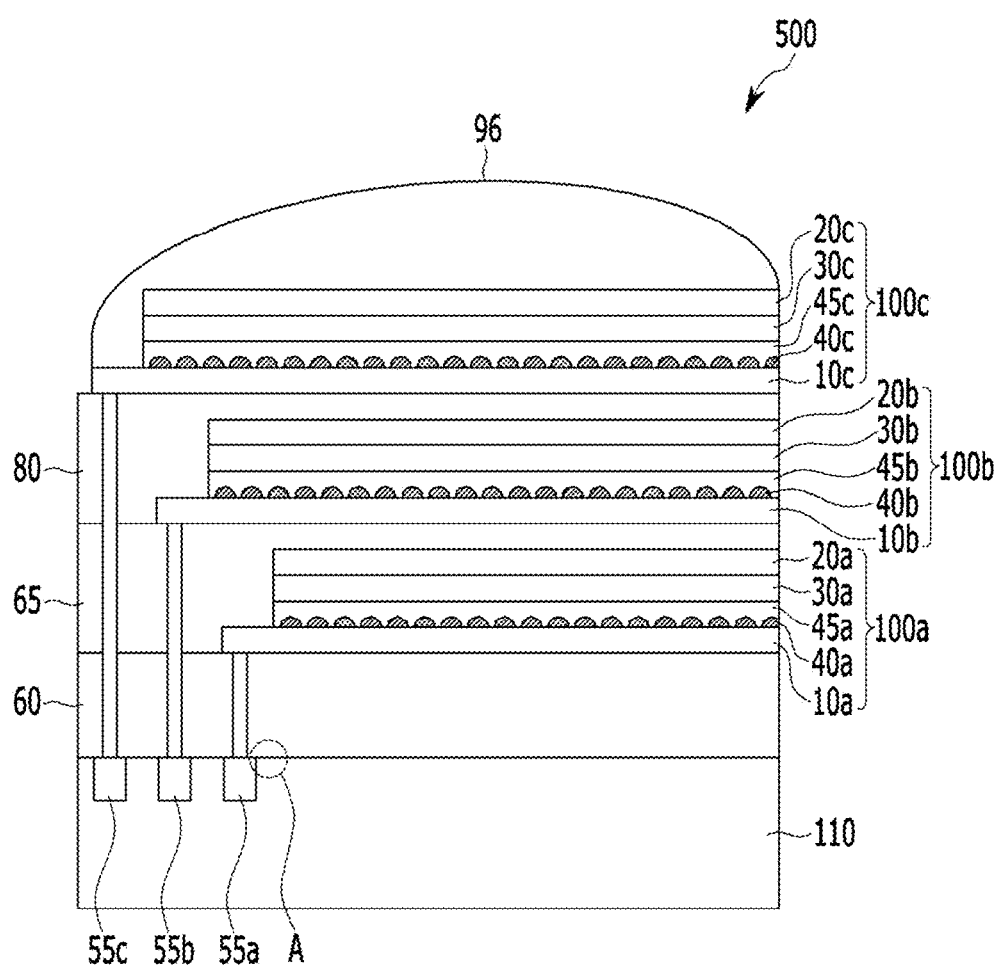
FIG. 9A is a cross-sectional view of the CMOS image sensor of FIG. 8.
Figure 9B:
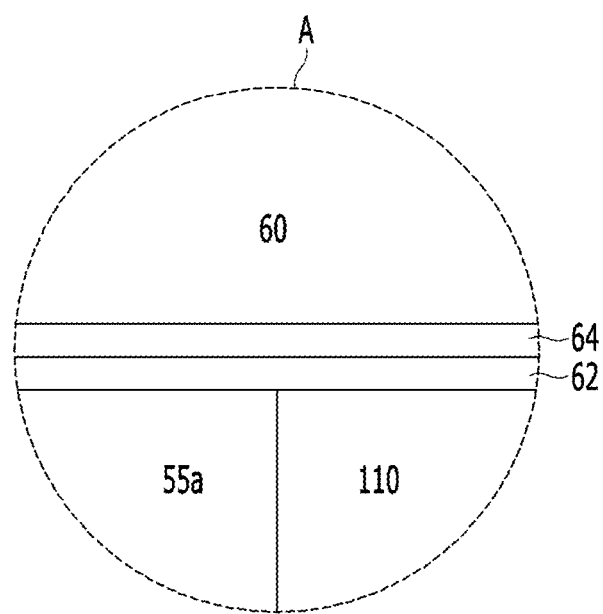
FIG. 9B is a cross-section view of a portion A of the image sensor 500 illustrated in FIG. 9A.

FIG. 8 is a schematic top plan view showing a CMOS image sensor according to example embodiments. FIG. 9A is a cross-sectional view of a CMOS image sensor of FIG. 8 and FIG. 9B is a cross-section view of a portion A of the image sensor 500 illustrated in FIG. 9A.

The CMOS image sensor 500 according to example embodiments includes a green photoelectric device configured to selectively absorb light in a green wavelength region, a blue photoelectric device configured to selectively absorb light in a blue wavelength region, and a red photoelectric device configured to selectively absorb light in a green wavelength region, and they are stacked.

The CMOS image sensor 500 according to example embodiments includes a semiconductor substrate 110, a lower insulation layer 60, an intermediate insulation layer 65, an upper insulation layer 80, a first photoelectric device 100a, a second photoelectric device 100b, and a third photoelectric device 100c.

The semiconductor substrate 110 may be a silicon substrate, and is integrated with the transmission transistor 90 and the charge storages 55a, 55b, and 55c.

In some example embodiments, including the example embodiments shown in FIG. 9B, a metal wire 62 and a pad 64 are formed on the semiconductor substrate 110, and the lower insulation layer 60 is formed on the metal wire 62 and the pad 64.

The first photoelectric device 100a is formed on the lower insulation layer 60.

The first photoelectric device 100a includes a first electrode 10a and a second electrode 20a facing each other, a photoelectric conversion layer 30a disposed between the first electrode 10a and the second electrode 20a, and nanostructures 40a and an auxiliary layer 45a disposed between the photoelectric conversion layer 30a and the first electrode 10a. The first electrode 10a, the second electrode 20a, the photoelectric conversion layer 30a, the nanostructures 40a, and the auxiliary layer 45a are the same described above, the photoelectric conversion layer 30a selectively absorbs light in one wavelength region of red, blue, and the green nanostructures 40a selectively reflects light in one wavelength region of red, blue, and green. For example, the first photoelectric device 100a may be a red photoelectric device, wherein the photoelectric conversion layer 30a selectively absorbs light in a red wavelength region, the plurality of nanostructures 40a selectively reflects light in a red wavelength region into the photoelectric conversion layer 30a, and thereby increases absorbance of the photoelectric conversion layer 30a.

The intermediate insulation layer 65 is formed on the first photoelectric device 100a.

The second photoelectric device 100b is formed on the intermediate insulation layer 65.

The second photoelectric device 100b includes a first electrode 10b and a second electrode 20b facing each other, a photoelectric conversion layer 30b disposed between the first electrode 10b and the second electrode 20b, and nanostructures 40b and an auxiliary layer 45b disposed between the photoelectric conversion layer 30b and the first electrode 10b. The first electrode 10b, the second electrode 20b, the photoelectric conversion layer 30b, the nanostructures 40b, and the auxiliary layer 45b are the same as described above, the photoelectric conversion layer 30b selectively absorbs light in one wavelength region of red, blue, and green, the nanostructures 40b selectively reflects light in one wavelength region of red, blue, and green. For example, the second photoelectric device 100b may be a blue photoelectric device, wherein the photoelectric conversion layer 30b selectively absorbs light in a blue wavelength region, the plurality of nanostructures 40b reflects light in a blue wavelength region into the photoelectric conversion layer 30b, and thereby increases absorbance of the photoelectric conversion layer 30b.

The upper insulation layer 80 is formed on the second photoelectric device 100b. The lower insulation layer 60, the intermediate insulation layer 65 and the upper insulation layer 80 have a plurality of through-holes exposing the charge storages 55a, 55b, and 55c.

The third photoelectric device 100c is formed on the upper insulation layer 80. The third photoelectric device 100c includes a first electrode 10c and a second electrode 20c facing each other, a photoelectric conversion layer 30c disposed between the first electrode 10c and the second electrode 20c, and nanostructures 40c and an auxiliary layer 45c disposed between the photoelectric conversion layer 30c and the first electrode 10c. The first electrode 10c, the second electrode 20c, the photoelectric conversion layer 30c, the nanostructures 40c, and the auxiliary layer 45c are the same described above, and the photoelectric conversion layer 30c may selectively absorb light in one of red, blue, and green wavelength regions, and the nanostructures 40c may selectively reflect light in one of the red, blue, and green wavelength regions. For example, the third photoelectric device 100c may be a green photoelectric device, wherein the photoelectric conversion layer 30c selectively absorbs light in a green wavelength region, the plurality of nanostructures 40c selectively reflects light in a green wavelength region into the photoelectric conversion layer 30c, and thereby increases absorbance of the photoelectric conversion layer 30c.

Focusing lens 96 may be further formed on the third photoelectric device 100c. The focusing lens may control a direction of incident light and gather the light in one region. The focusing lens may have a shape of, for example, a cylinder or a hemisphere, but is not limited thereto.

In the drawing, the first photoelectric device 100a, the second photoelectric device 100b, and the third photoelectric device 100c are for example the photoelectric device of FIG. 1, but the present disclosure is not limited thereto. One or two of the first photoelectric device 100*a*, the second photoelectric device 100*b*, and the third photoelectric device 100*c* may be, for example, the photoelectric device of FIG. 1.

In the drawing, the first photoelectric device 100*a*, the second photoelectric device 100*b*, and the third photoelectric device 100*c* are sequentially stacked, but the present disclosure is not limited thereto, and they may be stacked in various orders.

As described above, the first photoelectric device 100*a*, the second photoelectric device 100*b*, and the third photoelectric device 100*c* that absorb light in different wavelength regions have a stack structure, and thus the size of an image sensor may be reduced to realize a down-sized image sensor.

The image sensor may be applied to, for example, various electronic devices including a mobile phone or a digital camera, but is not limited thereto.

Figure 10:
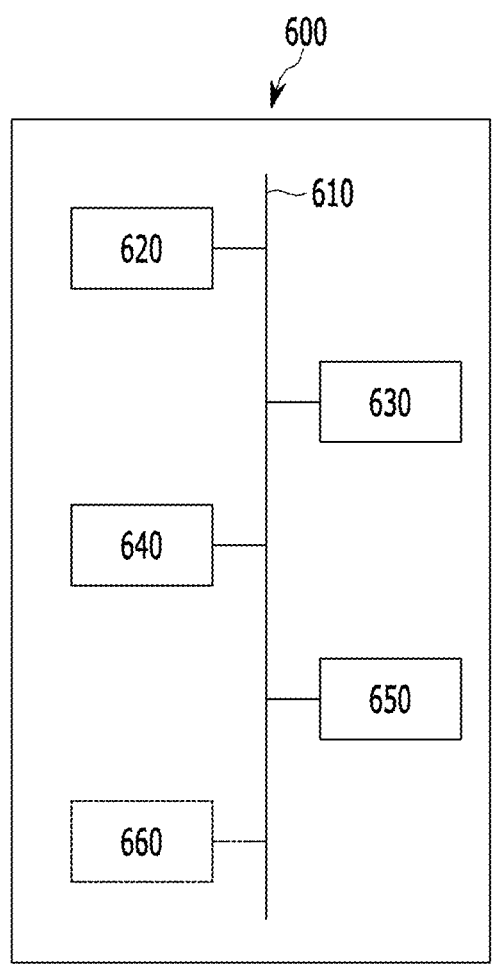
FIG. 10 is a diagram illustrating an electronic device 600 according to some example embodiments.

FIG. 10 is a diagram illustrating an electronic device 600 according to some example embodiments.

Referring to FIG. 10, the electronic device 600 includes a memory 620, a processor 630, an image sensor 640, and a communication interface 650. The image sensor 640 may include any of the image sensors illustrated and described herein, including image sensor 300 shown in FIGS. 5 and 6A-6B and image sensor 400 shown in FIGS. 8 and 9A-9B.

The electronic device 600 may be included in one or more various electronic devices, including, for example, a mobile phone, a digital camera, etc. In example embodiments, the electronic device 600 may include one or more of an image providing server, a mobile device, a computing device, an image outputting device, and an image capturing device. A mobile device may include a mobile phone, a smartphone, a personal digital assistant (PDA), some combination thereof, etc. A computing device may include a personal computer (PC), a tablet computer, a laptop computer, a netbook, some combination thereof, etc. An image outputting device may include a TV, a smart TV, some combination thereof, etc. An image capturing device may include a camera, a camcorder, some combination thereof, etc.

The memory 620, the processor 630, the image sensor 640, and the communication interface 650 may communicate with one another through a bus 610.

The communication interface 650 may communicate data from an external device using various Internet protocols. For example, the communication interface 650 may communicate sensor data generated by the image sensor 640 to an external device. The external device may include, for example, an image providing server, a display device, a mobile device including, a mobile phone, a smartphone, a personal digital assistant (PDA), a tablet computer, and a laptop computer, a computing device including a personal computer (PC), a tablet PC, and a netbook, an image outputting device including a TV and a smart TV, and an image capturing device including a camera and a camcorder.

The processor 630 may execute a program and control the electronic device 600. A program code to be executed by the processor 630 may be stored in the memory 620. An electronic system may be connected to an external device through an input/output device (not shown) and exchange data with the external device.

The memory 620 may store information output from the image sensor 640, including information transmitted from the transistor 90. The memory 620 may be a volatile or a nonvolatile memory. The memory 620 may be a non-transitory computer readable storage medium. The memory may store computer-readable instructions that, when executed, cause the execution of one or more methods, functions, processes, etc. as described herein. In some example embodiments, the processor 630 may execute one or more of the computer-readable instructions stored at the memory 620.

In some example embodiments, the electronic device may include a display panel 660 that may output an image generated based at least in part upon information output from the image sensor 640.

In some example embodiments, element 660 may be absent from the electronic device 600. In some example embodiments, the communication interface 650 may include a USB and/or HDMI interface. In some example embodiments, the communication interface 650 may include a wireless communication interface.

Figure 11:
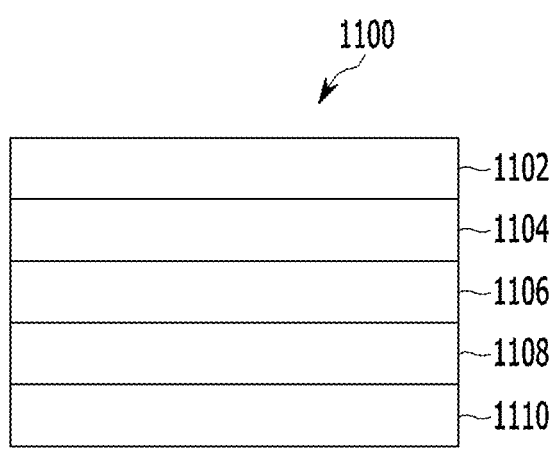
FIG. 11 is a cross-sectional view showing a solar cell according to some example embodiments.

FIG. 11 is a cross-sectional view showing a solar cell 1100 according to some example embodiments. Referring to FIG. 11, a solar cell 1100 includes a first electrode 1102 and a second electrode 1110, and a photoactive layer 1106 positioned between the first electrode 1102 and the second electrode 1110.

A substrate (not shown) may be positioned at the first electrode 1102 or the second electrode 1110, and may include a light-transmitting material. The light-transmitting material may include, for example, an inorganic material (e.g., glass), or an organic material (e.g., polycarbonate, polymethylmethacrylate, polyethylene terephthalate, polyethylene naphthalate, polyamide, polyethersulfone, or a combination thereof).

One of the first electrode 1102 and the second electrode 1110 is an anode and the other is a cathode. At least one of the first electrode 1102 and second electrode 1110 may be a light-transmitting electrode, and light may enter toward the light-transmitting electrode. The light-transmitting electrode may be made of, for example, a conductive oxide (e.g., indium tin oxide (ITO)), indium doped zinc oxide (IZO), tin oxide ($SnO_2$), aluminum-doped zinc oxide (AZO), and/or gallium-doped zinc oxide (GZO), or a transparent conductor of a conductive carbon composite (e.g., carbon nanotubes (CNT) or graphenes). At least one of the first electrode 1102 and the second electrode 1110 may be an opaque electrode, which may be made of an opaque conductor, for example, aluminum (Al), silver (Ag), gold (Au), and/or lithium (Li).

The photoactive layer 1106 may include an organic photoelectronic device according to some example embodiments.

First and second auxiliary layers 1104 and 1108 may be positioned between the first electrode 1102 and the photoactive layer 1106 and between the second electrode 1110 and the photoactive layer 1106, respectively. The first and second auxiliary layers 1104 and 1108 may increase charge mobility between the first electrode 1102 and the photoactive layer 1106 and between the second electrode 1110 and the photoactive layer 1106. The first and second auxiliary layers 1104 and 1106 may be at least one selected from, for example, an electron injection layer (EIL), an electron transport layer, a hole injection layer (HIL), a hole transport layer, and a hole blocking layer, but are not limited thereto. One or both of the first and second auxiliary layers 1104 and 1108 may be omitted.

The photoactive layer 1106 may have a tandem structure where at least two thereof are stacked.

Figure 12:
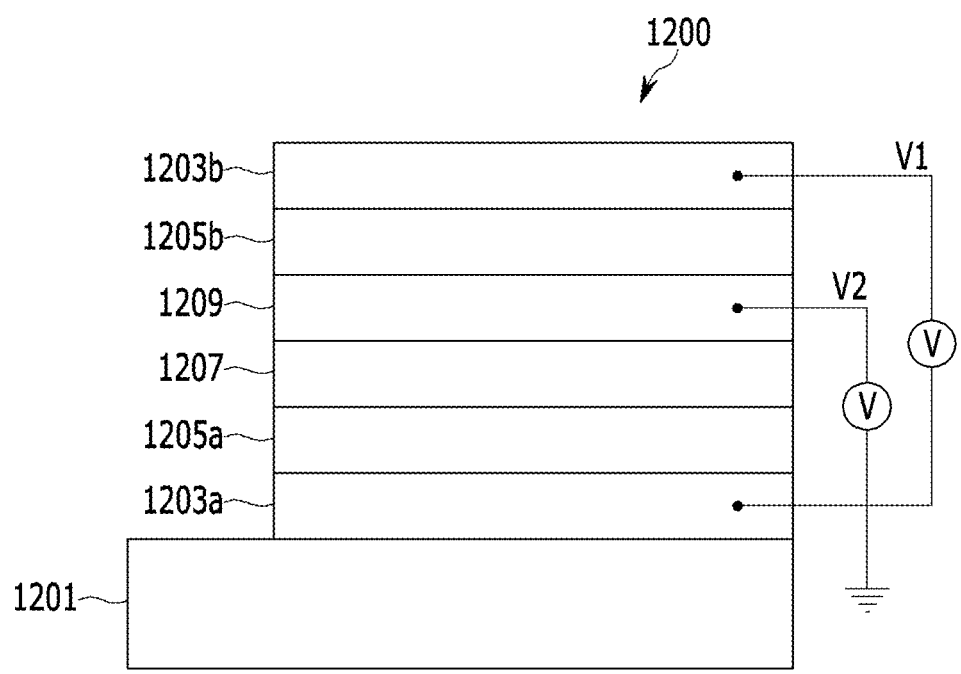
FIG. 12 is a sectional view of an organic light-emitting display apparatus according to some example embodiments.

FIG. 12 is a sectional view of an organic light-emitting display apparatus 1200 according to some example embodiments.

Referring to FIG. 12, a first electrode 1203*a* and a second electrode 1203*b* are positioned on a substrate 1201, a first emission layer 1205*a* is positioned on the first electrode 1203a, and a second emission layer 1205b is positioned under the second electrode 1203b.

The substrate 1201 may include a material selected from the group consisting of glass, quartz, silicon, a synthetic resin, a metal, and a combination thereof. The synthetic resin may include polyethylene naphthalate (PEN), polyethylene terephthalate (PET), polycarbonate, polyvinyl alcohol, polyacrylate, polyimide, polynorbornene and/or polyethersulfone (PES), etc. The metal plate may include a stainless steel foil and/or an aluminum foil, etc.

The first electrode 1203a may include a material having a work function of about 4.3 eV to about 5.0 eV, about 4.3 eV to about 4.7 eV, or about 4.3 eV to about 4.5 eV. According to example embodiments, the material may include aluminum (Al), copper (Cu), magnesium (Mg), molybdenum (Mo) and/or an alloy thereof, etc. In addition, these metals may be laminated to provide a first electrode. The first electrode 1203a may have a thickness of about 120 to about 120 nm.

The second electrode 1203b may include a material having a work function of about 12.3 eV to about 12.7 eV or about 12.5 eV to about 12.7 eV. According to some example embodiments, the second electrode 1203b may include Ba:Al. The second electrode 1203b may have a thickness of about 120 to about 120 nm.

The first emission layer 1205a and the second emission layer 1205b may include an organic photoelectronic device according to some example embodiments.

A middle electrode 1209 is positioned between the first emission layer 1205a and the second emission layer 1205b. The middle electrode 1209 may include a material having a work function of about 5.0 eV to about 5.2 eV. According to some example embodiments, the material may include a conductive polymer. The conductive polymer may include polythiophene, polyaniline, polypyrrole, polyacene, polyphenylene, polyphenylenevinylene, a derivative thereof, a copolymer thereof, or a mixture thereof.

A buffer layer 1207 may be positioned between the first emission layer 1205a and the middle electrode 1209, and may include a material selected from the group consisting of a metal oxide, a polyelectrolyte, and combinations thereof. The combination thereof refers to the metal oxide and polyelectrolyte being mixed or laminated to provide a multi-layer. In addition, the different kinds of metal oxide or polyelectrolyte may be laminated.

Figure 13:
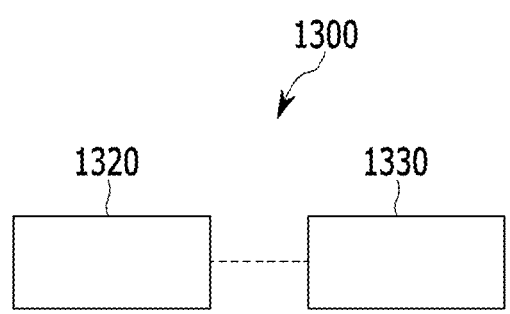
FIG. 13 is a view showing a sensor according to some example embodiments.

FIG. 13 is a view showing a sensor 1300 according to some example embodiments.

Referring to FIG. 13, a sensor 1300 (for example a gas sensor, light sensor, energy sensor, but example embodiments are not limited thereto) includes at least one electrode 1320 configured to output a signal to a processor 1330. The processor 1330 may include a microprocessor, but example embodiments are not limited thereto. The electrode 1320 may include an organic photoelectronic device according to some example embodiments.

Hereinafter, the present disclosure is illustrated in more detail with reference to examples. However, these are examples, and the present disclosure is not limited thereto.

Manufacture of Photoelectric Device I

Example 1

A 150 nm-thick anode is formed by sputtering ITO on a glass substrate. Subsequently, an about 2 nm-thick silver (Ag) thin film is thermally vacuum-deposited on the anode and then, heat-treated at about 150° C. to form a plurality of hemispherical silver (Ag) nanostructures having a radius of about 2 nm. On the plurality of silver (Ag) nanostructures, a compound represented by Chemical Formula A is deposited to form a 5 nm-thick auxiliary layer. On the auxiliary layer, a compound represented by Chemical Formula B as a p-type semiconductor and C60 as an n-type semiconductor are co-deposited in a volume ratio of 2:1 to form a 60 nm-thick photoelectric conversion layer. On the photoelectric conversion layer, a 7 nm-thick cathode is formed by sputtering ITO. Subsequently, a 50 nm-thick anti-reflection layer is formed by depositing aluminum oxide ($Al_2O_3$) on the cathode, and then, a glass plate is used for sealing to manufacture a photoelectric device.

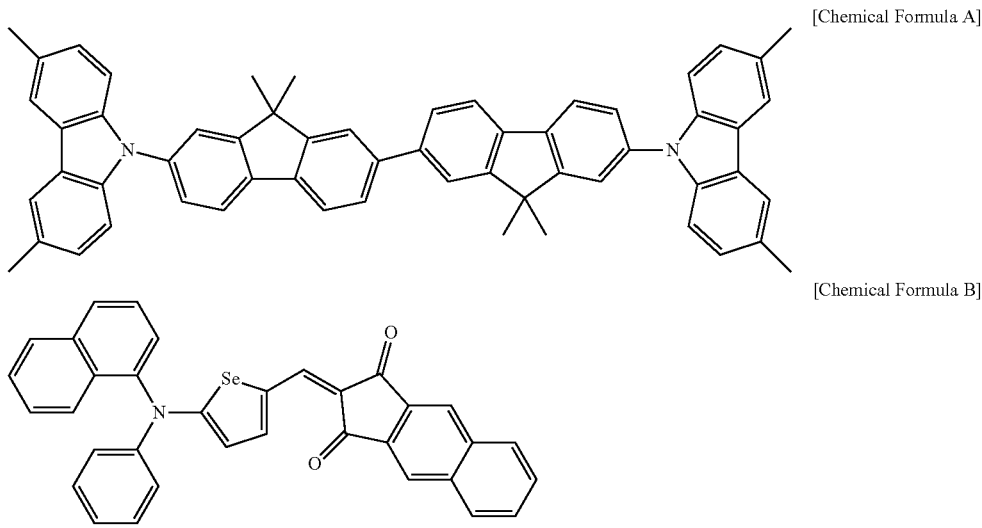

[Chemical Formula A]

[Chemical Formula B]

Example 2

A photoelectric device is manufactured according to the same method as Example 1 except for forming gold (Au) nanostructures instead of the silver (Ag) nanostructures.

Comparative Example 1

A photoelectric device is manufactured according to the same method as Example 1 except for forming no silver (Ag) nanostructure.

Evaluation I

The silver (Ag) nanostructures of the photoelectric device according to Example 1 are examined.

Figure 14:
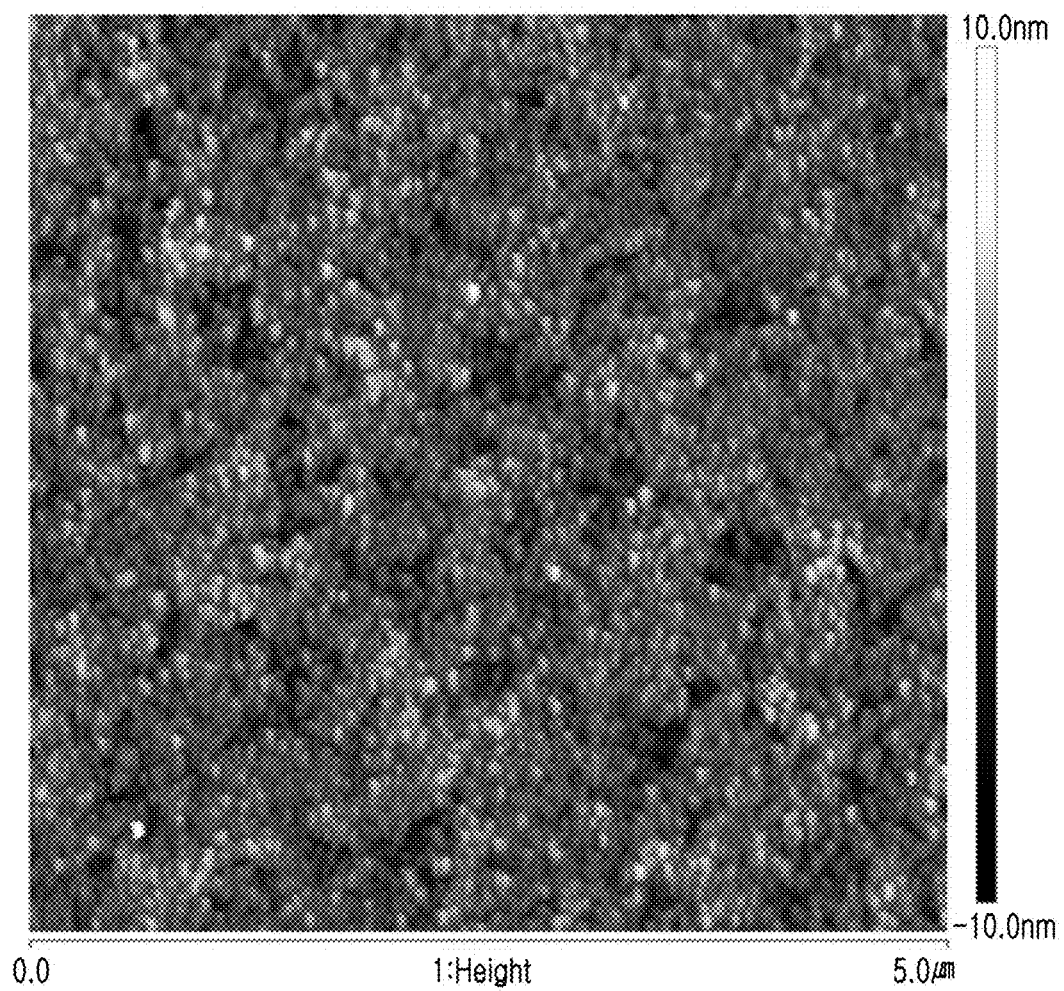
FIG. 14 is a transmission electronmicroscopy (TEM) photograph of the silver (Ag) nanostructures of photoelectric device according to Example 1.

FIG. 14 is a transmission electronmicroscopy (TEM) photograph showing the silver (Ag) nanostructure of the photoelectric device according to Example 1.

Referring to FIG. 14, in the photoelectric device of Example 1, it is confirmed that the plurality of hemispherical silver (Ag) nanostructures are relatively uniformly formed.

Evaluation II

Light absorption characteristics of the photoelectric devices according to Example 1 and Comparative Example 1 are evaluated.

Figure 15:
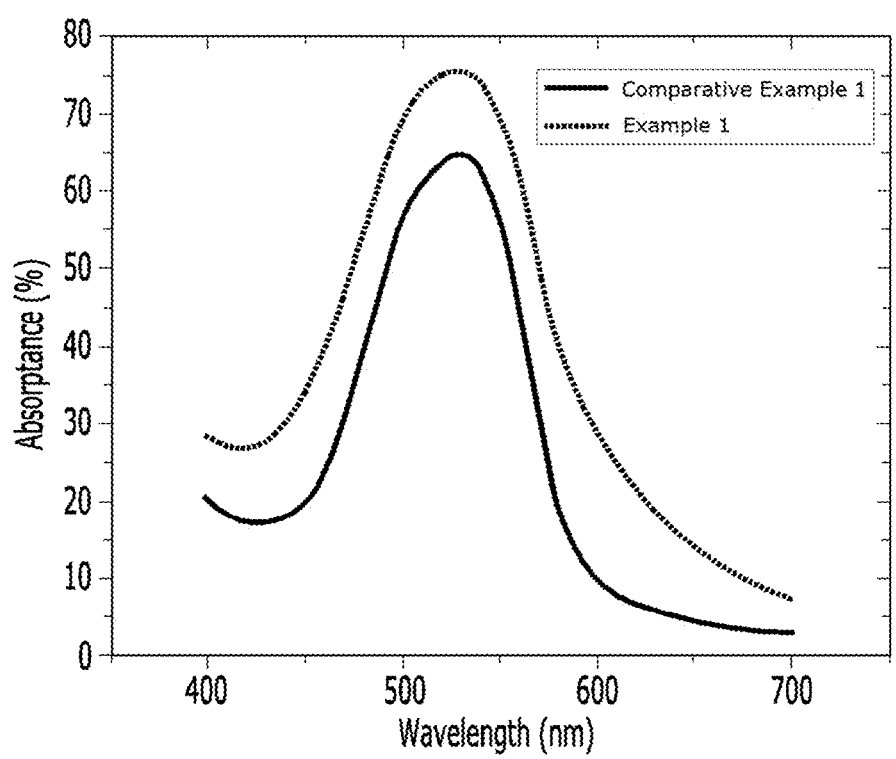
FIG. 15 is a graph showing absorbance depending on a wavelength of the photoelectric devices according to Example 1 and Comparative Example 1.

The light absorption characteristics are measured by using a UV-Vis spectrometer (UV2450, Shimadzu Corp.). FIG. 15 is a graph showing absorbance of the photoelectric devices according to Example 1 and Comparative Example 1 depending on a wavelength.

Referring to FIG. 15, the photoelectric devices of Example 1 and Comparative Example 1 have a maximum absorption wavelength ($\lambda_{max}$) in a green wavelength region of about 520 nm to 580 nm, but the photoelectric device of Example 1 shows higher absorbance at the maximum absorption wavelength ($\lambda_{max}$) than the photoelectric device of Comparative Example 1.

Accordingly, it is confirmed that the absorbance of the photoelectric device of Example 1 is increased, because light reflected by the silver (Ag) nanostructures is re-absorbed in a photoelectric conversion layer.

Manufacture of Photoelectric Device II

Light absorption characteristics of a photoelectric device depending on a radius (r) of a hemispherical nanostructure are examined through a simulation.

The simulation is performed to evaluate the light absorption characteristics by forming a hemispherical silver (Ag) or gold (Au) nanostructure of the photoelectric device according to Example 1 or 2 and changing a radius of the hemispherical silver (Ag) or gold (Au) nanostructure as shown in Tables 1 and 2.

The simulation is performed by using a Lumerical FDTD solution.

TABLE 1

| No. | Radius (r) (hemisphere) of Ag nanostructure |
|---|---|
| Reference Example 1 | Ag nanostructures are not included |
| Example 2 | 1 nm |
| Example 3 | 2 nm |
| Example 4 | 3 nm |
| Example 5 | 4 nm |
| Example 6 | 5 nm |
| Example 7 | 7.5 nm |

TABLE 2

| No. | Radius (r) (hemisphere) of Au nanostructure |
|---|---|
| Reference Example 2 | Au nanostructures are not included |
| Example 8 | 1 nm |
| Example 9 | 2 nm |
| Example 10 | 3 nm |
| Example 11 | 4 nm |
| Example 12 | 5 nm |
| Example 13 | 6 nm |
| Example 14 | 7.5 nm |

Evaluation III

Light absorption characteristics of a photoelectric device depending on a radius of a hemispherical nanostructure are examined.

Figure 16:
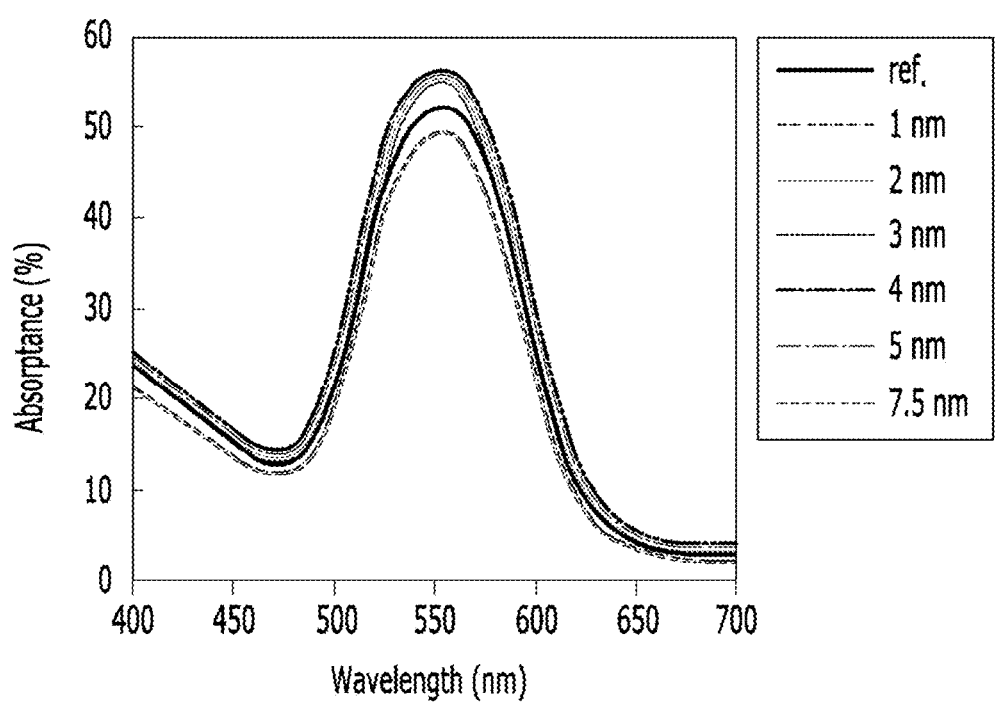
FIG. 16 is a graph showing absorbance at a maximum absorption wavelength ($\lambda_{max}$) depending on a wavelength of the photoelectric devices according to Examples 2 to 7.
Figure 17:
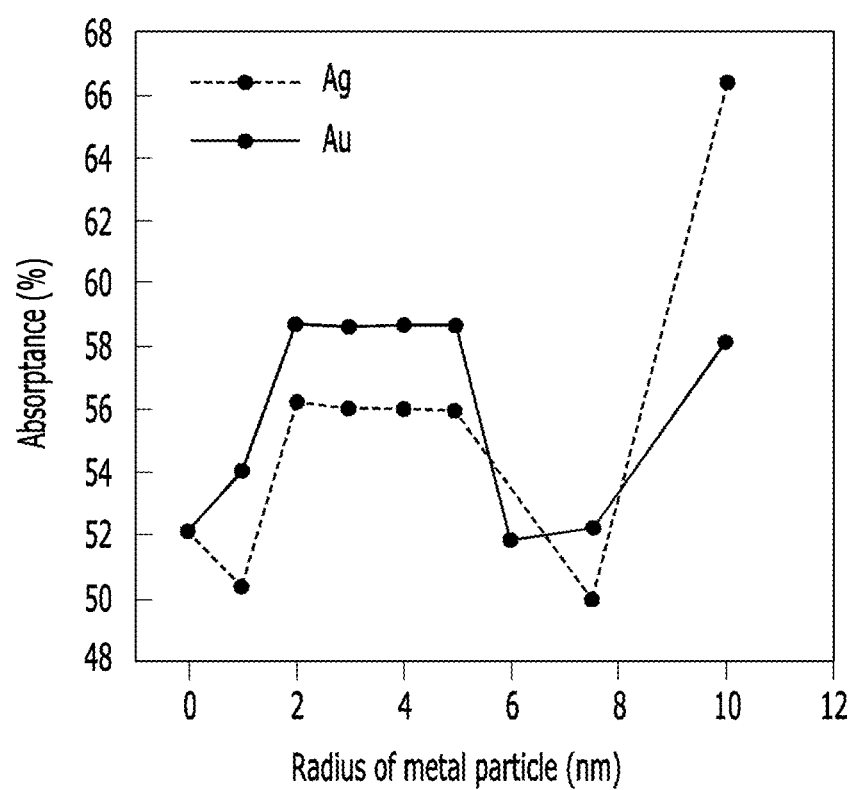
FIG. 17 is a graph showing absorbance at a maximum absorption wavelength ($\lambda_{max}$) depending on a radius of silver (Ag) nanostructures of the photoelectric devices according to Examples 2 to 7 and gold (Au) nanostructures of the photoelectric devices according to Examples 8 to 14.

FIG. 16 is a graph showing absorbance at a maximum absorption wavelength ($\lambda_{max}$) depending on a wavelength of the photoelectric devices according to Examples 2 to 7, and FIG. 17 is a graph showing absorbance at a maximum absorption wavelength ($\lambda_{max}$) depending on a radius of silver (Ag) nanostructures of the photoelectric devices according to Examples 2 to 7 and gold (Au) nanostructures of the photoelectric devices according to Examples 8 to 14.

Referring to FIG. 16, the photoelectric devices according to Examples 2 to 7 have a maximum absorption wavelength ($\lambda_{max}$) in a green wavelength region of about 520 nm to 580 nm, and the photoelectric devices respectively including each silver (Ag) nanostructure having a radius of about 2 nm, 3 nm, 4 nm, and 5 nm according to Examples 3 to 6 show higher absorbance at the maximum absorption wavelength ($\lambda_{max}$) than that of Reference Example 1.

Referring to FIG. 17, the photoelectric devices using a silver (Ag) or gold (Au) nanostructures having a radius of greater than or equal to about 2 nm and less than 6 nm show improved light absorption characteristics at a maximum absorption wavelength ($\lambda_{max}$) than the photoelectric device according to Reference Example 1 or 2 (a radius=0 nm).

Accordingly, light absorption characteristics are changed depending on a radius of a nanostructure, and herein, a hemispherical nanostructure having a radius of greater than or equal to about 2 nm and less than about 6 nm shows improved light absorption characteristics.

Manufacture of Photoelectric Device III

A simulation is performed to evaluate light absorption characteristics of a photoelectric device depending on a radius (r) of a hemiellipse-shaped nanostructure.

The simulation is performed to evaluate the light absorption characteristics by setting a hemiellipse-shaped silver (Ag) nanostructure of the photoelectric device according to Example 1 and changing a radius of the hemiellipse-shaped silver (Ag) nanostructure (a height (h=2 nm) as shown in Table 3.

TABLE 3

| No. | Radius (r) (hemiellipse, height (h) = 2 nm) of Ag nanostructure |
|---|---|
| Example 15 | 2 nm |
| Example 16 | 4 nm |
| Example 17 | 6 nm |
| Example 18 | 8 nm |

Evaluation IV

Light absorption characteristics of a photoelectric device depending on a radius of a hemispherical nanostructure are examined.

Figure 18:
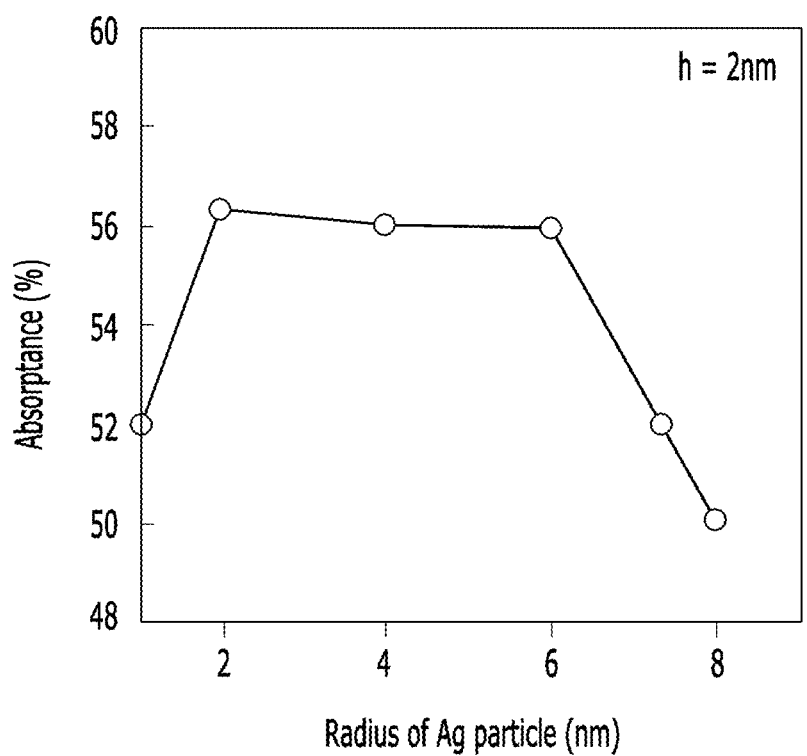
FIG. 18 is a graph showing absorbance depending on a radius of silver (Ag) nanostructures of the photoelectric devices according to Examples 15 to 18.

FIG. 18 is a graph showing absorbance depending on a radius of silver (Ag) nanostructures of the photoelectric devices according to Examples 15 to 18.

Referring to FIG. 18, a photoelectric device using a silver (Ag) nanostructure having a radius of greater than or equal to about 2 nm and less than 6 nm shows high light absorption characteristics at a maximum absorption wavelength ($\lambda_{max}$).

Accordingly, light absorption characteristics are changed depending on a radius of the silver (Ag) nanostructure, and the hemiellipse-shaped nanostructure having greater than or equal to about 2 nm and less than 6 nm shows improved light absorption characteristics.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A photoelectric device comprising:
   a first electrode and a second electrode facing each other,
   a photoelectric conversion layer between the first electrode and the second electrode, the photoelectric conversion layer including a light absorbing material configured to selectively absorb first visible light including one of visible light in a blue wavelength region of greater than or equal to about 380 nm and less than about 500 nm, visible light in a green wavelength region of about 500 nm to about 600 nm, and visible light in a red wavelength region of greater than about 600 nm and less than or equal to about 700 nm, and
   a plurality of nanostructures between the first electrode and the photoelectric conversion layer, the plurality of nanostructures configured to selectively reflect the first visible light,
   wherein each nanostructure of the plurality of nanostructures is separated with a predetermined interval from neighboring nanostructures of the plurality of nanostructures.

2. The photoelectric device of claim 1, wherein the plurality of nanostructures have a hemisphere or hemiellipse shape having a radius of greater than or equal to about 2 nm and less than 6 nm.

3. The photoelectric device of claim 1, wherein the plurality of nanostructures includes a reflective metal, a reflective semi-metal, a reflective oxide, a reflective nitride, a reflective organic material, or a combination thereof.

4. The photoelectric device of claim 1, wherein
   the plurality of nanostructures are on the first electrode, and
   the plurality of nanostructures cover about 20% to about 90% of an entire area of the first electrode.

5. The photoelectric device of claim 1, wherein the first visible light is the visible light in the green wavelength region of about 500 nm to about 600 nm.

6. The photoelectric device of claim 5, wherein the plurality of nanostructures transmits visible light in the blue wavelength region greater than or equal to about 380 nm and less than about 500 nm and visible light in the red wavelength region of greater than about 600 nm and less than or equal to about 700 nm.

7. The photoelectric device of claim 1, wherein
   the photoelectric conversion layer includes a p-type semiconductor and an n-type semiconductor, and
   at least one of the p-type semiconductor and the n-type semiconductor is the light absorbing material configured to selectively absorb the first visible light.

8. The photoelectric device of claim 7, wherein the p-type semiconductor is the light absorbing material configured to selectively absorb the first visible light.

9. The photoelectric device of claim 8, wherein the n-type semiconductor is fullerene or a fullerene derivative.

10. The photoelectric device of claim 8, wherein a composition ratio (p/n) of the p-type semiconductor relative to the n-type semiconductor of the photoelectric conversion layer is greater than about 1.0.

11. The photoelectric device of claim 10, wherein the composition ratio (p/n) of the p-type semiconductor relative to the n-type semiconductor of the photoelectric conversion layer is greater than or equal to about 1.5.

12. The photoelectric device of claim 11, wherein the composition ratio (p/n) of the p-type semiconductor relative to the n-type semiconductor of the photoelectric conversion layer is about 2.0 to about 3.0.

13. The photoelectric device of claim 1, wherein the photoelectric conversion layer has a thickness of less than or equal to about 100 nm.

14. The photoelectric device of claim 13, wherein the photoelectric conversion layer has a thickness of about 20 nm to about 80 nm.

15. The photoelectric device of claim 1, wherein the photoelectric device further includes an auxiliary layer between the photoelectric conversion layer and the plurality of nanostructures.

16. An image sensor comprising the photoelectric device of claim 1.

17. The image sensor of claim 16, wherein the plurality of nanostructures have a hemisphere or hemiellipse shape having a radius of greater than or equal to about 2 nm and less than 6 nm.

18. The image sensor of claim 16, wherein
   the plurality of nanostructures are on the first electrode, and
   the plurality of nanostructures cover about 20% to about 90% of an entire area of the first electrode.

19. The image sensor of claim 16, wherein
   the photoelectric conversion layer includes a p-type semiconductor and an n-type semiconductor to form a pn junction, and
   at least one of the p-type semiconductor and the n-type semiconductor is the light absorbing material configured to selectively absorb the first visible light.

20. An electronic device comprising the image sensor of claim 16.

21. An image sensor comprising:
   a semiconductor substrate integrated with at least one first photo-sensing device and at least one second photo-sensing device, the first photo-sensing device configured to sense light in a first visible light wavelength region and the second photo-sensing device configured to sense light in a second visible light wavelength region; and
   at least one third photo-sensing device on the semiconductor substrate, the third photo-sensing device configured to selectively absorb light in a third visible light wavelength region, the third photo-sensing device including the photoelectric device of claim 1.

22. The image sensor of claim 21, wherein each of the first, second and third visible light wavelength regions is one of visible light in the blue wavelength region of greater than or equal to about 380 nm and less than about 500 nm, visible light in the green wavelength region of about 500 nm to about 600 nm, and visible light in the red wavelength region of greater than about 600 nm and less than or equal to about 700 nm.

* * * * *